(12) United States Patent
Lee et al.

(10) Patent No.: US 8,691,930 B2
(45) Date of Patent: Apr. 8, 2014

(54) POLYMER COMPOUND AND ORGANIC LIGHT-EMITTING DEVICE INCLUDING THE SAME

(75) Inventors: Jae-Yong Lee, Yongin (KR); Hee-Yeon Kim, Yongin (KR); Seung-Gak Yang, Yongin (KR); Yoon-Hyun Kwak, Yongin (KR); Jeoung-In Yi, Yongin (KR)

(73) Assignee: Samsung Display Co., Ltd. (KR)

( * ) Notice: Subject to any disclaimer, the term of this patent is extended or adjusted under 35 U.S.C. 154(b) by 550 days.

(21) Appl. No.: 13/076,160

(22) Filed: Mar. 30, 2011

(65) Prior Publication Data

US 2011/0240975 A1    Oct. 6, 2011

(30) Foreign Application Priority Data

Apr. 2, 2010   (KR) .................. 10-2010-0030501

(51) Int. Cl.
   *C08G 18/00*   (2006.01)
(52) U.S. Cl.
   USPC .............. 528/62; 528/163; 528/94; 528/99; 528/118; 528/377; 528/403; 528/423; 544/10; 544/38; 347/1
(58) Field of Classification Search
   USPC .............. 528/62, 163, 94, 99, 118, 377, 403, 528/423; 544/10, 38; 347/1
   See application file for complete search history.

(56) References Cited

U.S. PATENT DOCUMENTS

| | | |
|---|---|---|
| 2004/0127666 A1 | 7/2004 | Inbasekaran |
| 2007/0003787 A1 | 1/2007 | Lee et al. |
| 2007/0173633 A1 | 7/2007 | Son et al. |
| 2007/0278455 A1 | 12/2007 | Park et al. |
| 2008/0018238 A1 | 1/2008 | Gessner et al. |

FOREIGN PATENT DOCUMENTS

| | | |
|---|---|---|
| EP | 2202257 A1 | 6/2010 |
| JP | 2006-511659 A | 4/2006 |
| JP | 2008095080 A | 4/2008 |
| KR | 10-2003-0097658 A | 12/2003 |
| KR | 10-2007-0078200 A | 7/2007 |
| KR | 10-2007-0090214 | 9/2007 |
| KR | 10-2007-0116441 A | 12/2007 |
| KR | 10-2009-0010762 A | 1/2009 |

OTHER PUBLICATIONS

Official Action issued by the Korean Industrial Property Office dated Dec. 15, 2011, 3 pages.
Extended European Search Report issued from the European Patent Office dated Jun. 27, 2011.

*Primary Examiner* — Shane Fang
(74) *Attorney, Agent, or Firm* — Knobbe, Martens, Olson & Bear, LLP

(57) ABSTRACT

A polymer represented by Formula 1 below:

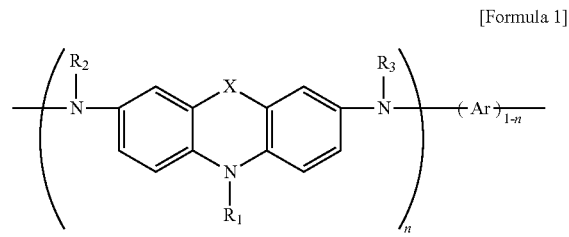

[Formula 1]

wherein functional groups and n are defined as in the specification.

14 Claims, 2 Drawing Sheets

POLYMER COMPOUND AND ORGANIC LIGHT-EMITTING DEVICE INCLUDING THE SAME

CROSS-REFERENCE TO RELATED APPLICATIONS

This application claims the benefit of Korean Patent Application No. 10-2010-0030501, filed on Apr. 2, 2010, in the Korean Intellectual Property Office, the disclosure of which is incorporated herein in its entirety by reference.

BACKGROUND

1. Field

Some embodiments relate to a polymer compound and an organic light-emitting device including the same.

2. Description of the Related Technology

Organic electroluminescent devices may be made lightweight and thin, realize various colors, have a fast switching speed, and achieve high brightness at a low driving voltage. As a result, outstanding achievements have been accomplished in a short period of time with regard to the performances of such devices such as balanced charge injection by a multi-layered structure, improvements in color adjustment through doping and quantum efficiency, and development of new electrode materials using alloys.

Light is emitted when electricity is applied to poly(1,4-phenylenevinylene (PPV)) an example of π-conjugated polymer. The π-conjugated polymer has a chemical structure in which single bonds (or σ-bond) or double bonds (or π-bond) alternately exist and thus has π-electrons that are not lateralized and may freely move along bond chains. According to such a characteristic of a semiconductor, the π-conjugated polymers may be applied to an emission layer of an organic electroluminescent device, and light in the entire visible light area that corresponds to HOMO-LUMO band-gap may be easily obtained by a molecular design. Also, a thin film may be simply formed by spin coating or printing so that a process of manufacturing the devices is simple and cost thereof is low. Also, the π-conjugated polymers have high glass transition temperature, and thus, a thin film having excellent mechanical properties may be provided.

However, in organic electroluminescent devices including polymers, problems such as deterioration of color purity, high driving voltage, and low efficiency may occur, and studies to overcome such problems have been widely conducted. For example, improvements in the electroluminescent properties by copolymerizing polymers containing fluorine or blending polymers containing fluorine have been proposed. However, the degree of improvement is still insufficient. Therefore, the development of polymer materials having excellent properties is required. The present embodiments overcome the above problems as well as provide additional advantages.

SUMMARY OF CERTAIN INVENTIVE ASPECTS

Embodiments provides a polymer having excellent hole transport capability.

Embodiments provide an organic light-emitting device including the polymer.

According to an aspect of the present invention, there is provided a polymer represented by Formula 1 below:

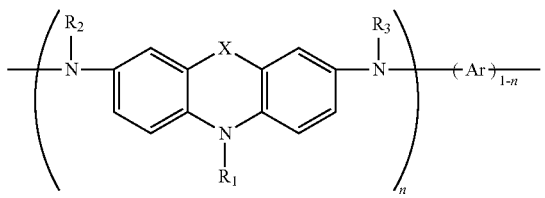

[Formula 1]

wherein, n is a real number in the range of about 0.01 to about 0.99,

X is O or S, $R_1$ is H, a linear $C_1$-$C_{20}$ alkyl group, a branched $C_1$-$C_{20}$ alkyl group, a cyclic $C_3$-$C_{20}$ alkyl group, or a $C_6$-$C_{14}$ aromatic group, wherein the aromatic group may be substituted with a $C_1$-$C_{20}$ alkyl group or a $C_1$-$C_{20}$ alkoxy group, $R_2$ and $R_3$ are each independently a $C_6$-$C_{26}$ aromatic group or a hetero aromatic group substituted with a heteroatom, wherein the aromatic group or the heteroaromatic group may be substituted with a $C_1$-$C_{20}$ alkyl group or a $C_1$-$C_{20}$ alkoxy group, and Ar is a linear $C_1$-$C_{20}$ alkyl group, a branched $C_1$-$C_{20}$ alkyl group, a $C_6$-$C_{26}$ aromatic group, or a heteroaromatic group substituted with a heteroatom, wherein the aromatic group or the heteroaromatic group is substituted with a $C_1$-$C_{20}$ alkyl group or a $C_1$-$C_{20}$ alkoxy group.

Ar may be one of the groups represented by Formula 2 below:

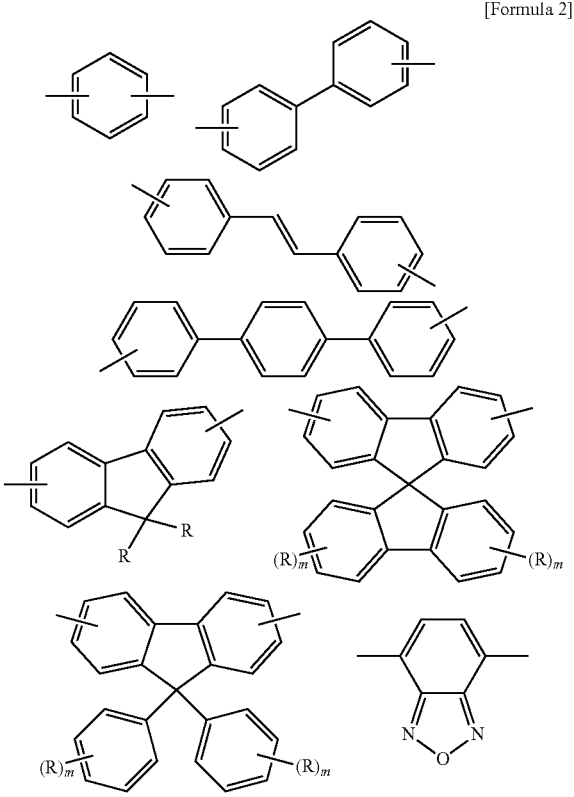

[Formula 2]

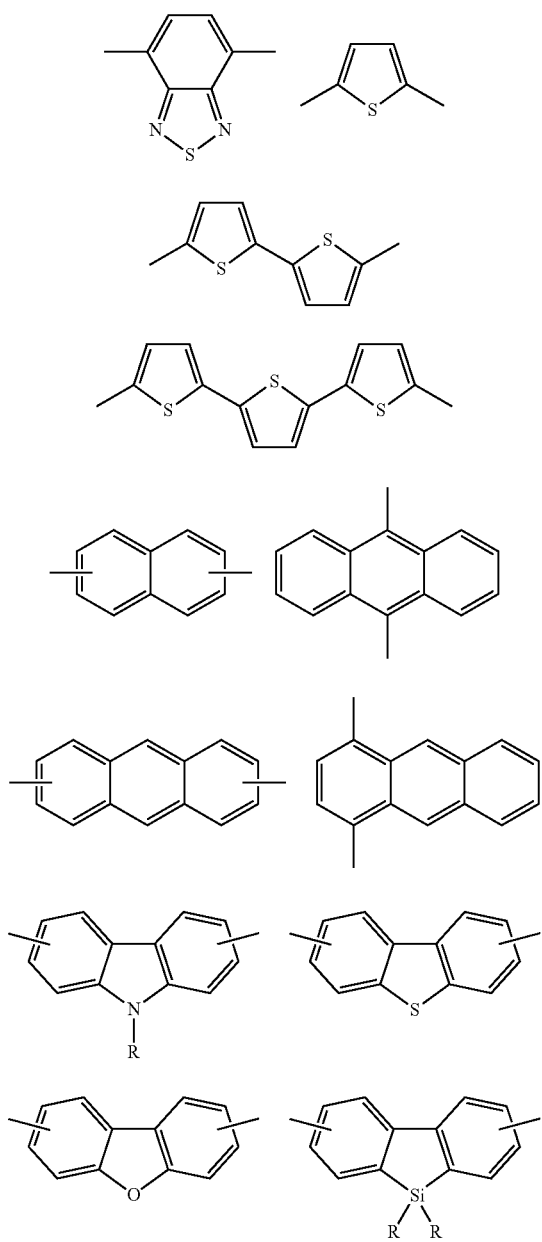
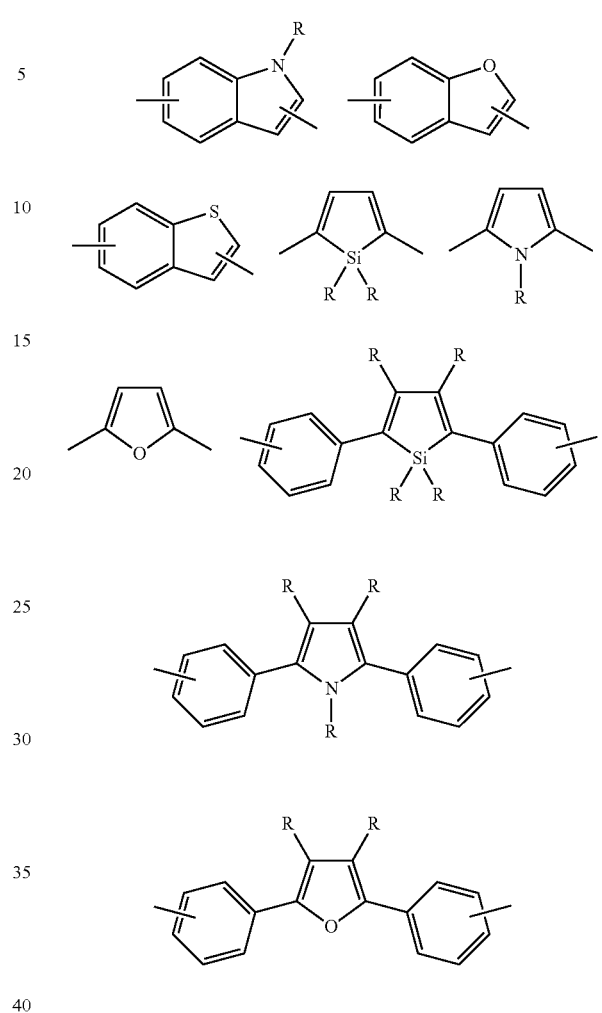
wherein, m is a positive number in the range of about 1 to about 4 and R is a $C_1$-$C_{20}$ alkyl group.
$R_1$, $R_2$, and $R_3$ may be each independently a phenyl group.
Weight-average molecular weight of the polymer may be in the range of about 10,000 to about 300,000.
The polymer may be represented by one of Formulae 3 through 9 below:
[Formula 3]
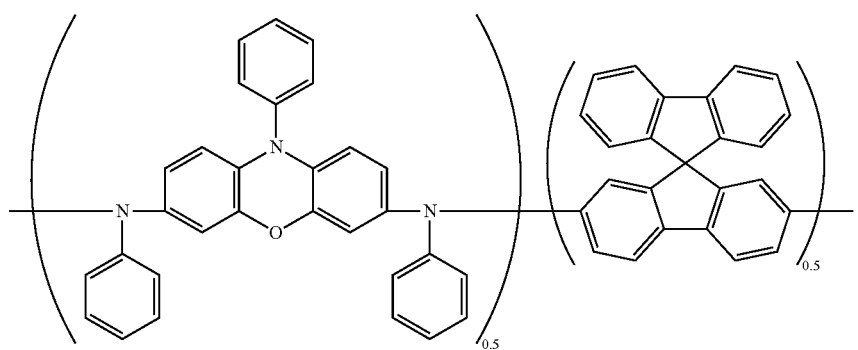

[Formula 4]
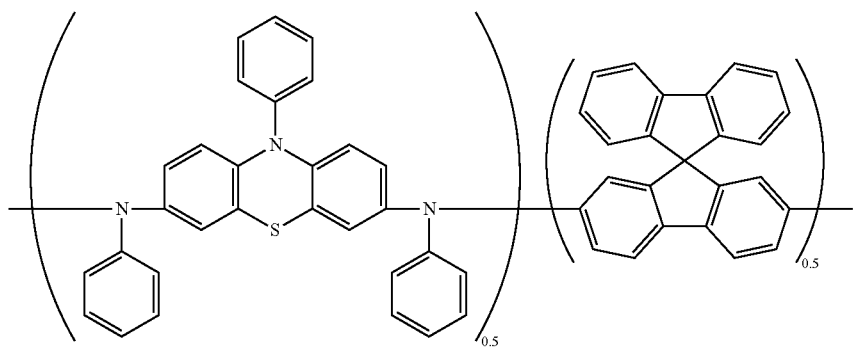
[Formula 5]
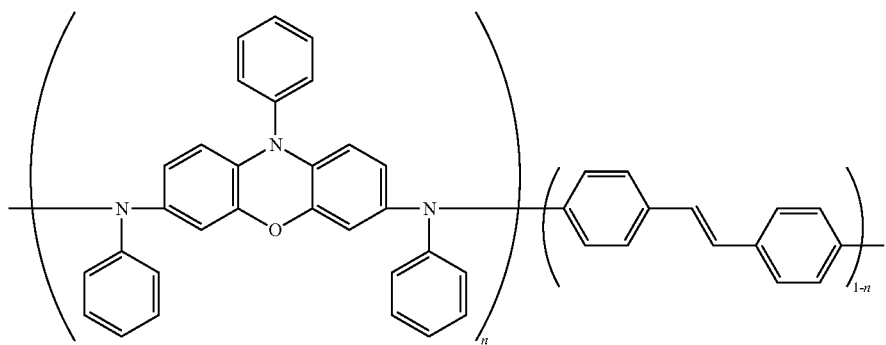
[Formula 6]
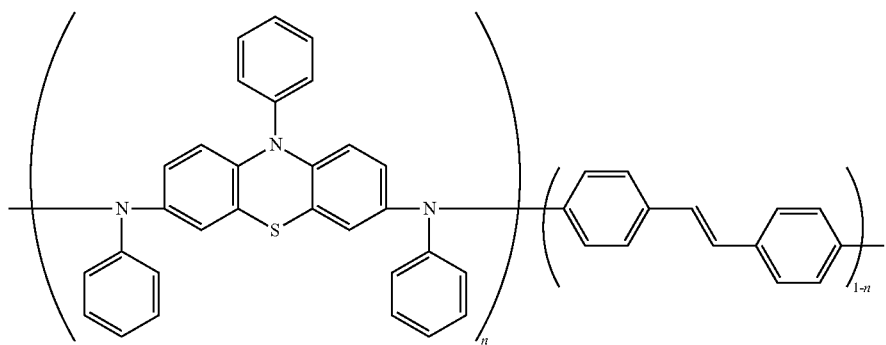
[Formula 7]
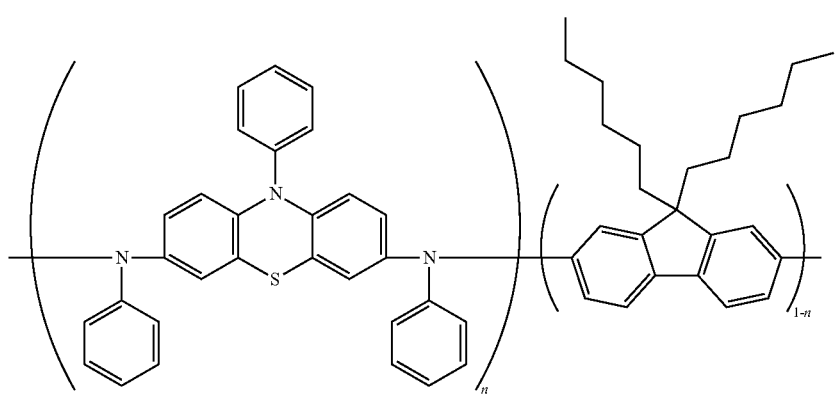

-continued

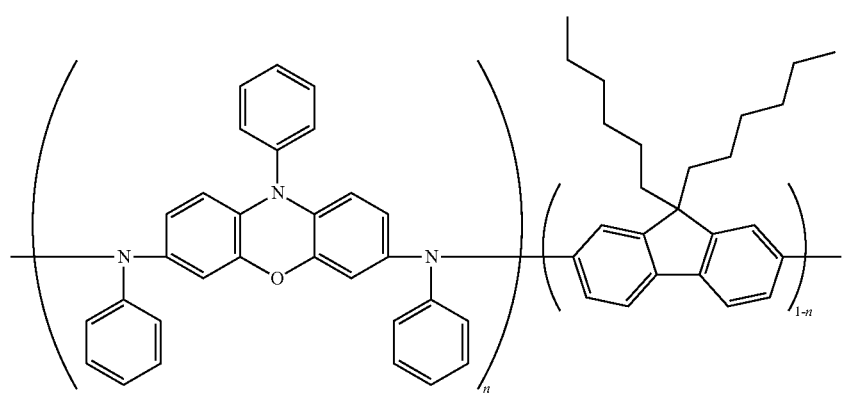

[Formula 8]

[Formula 9]

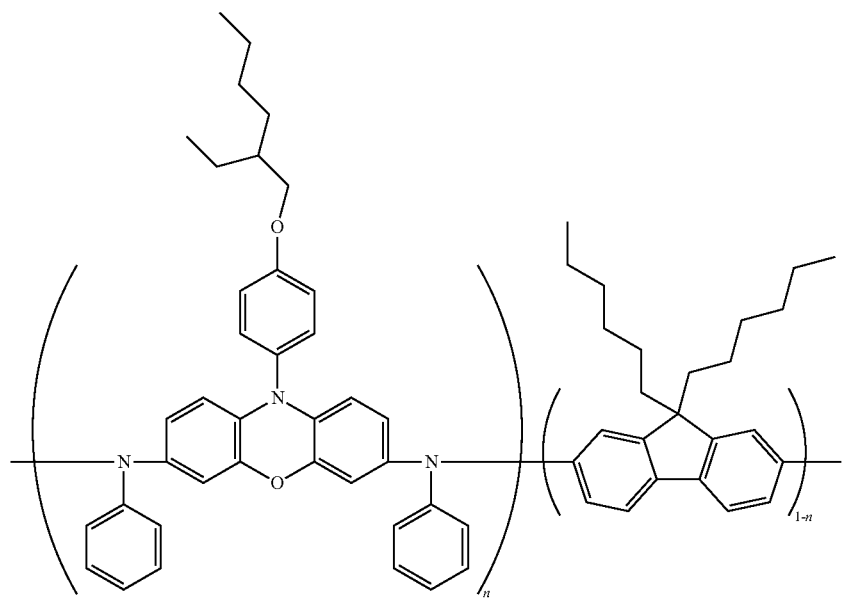

The molecular weight dispersion of the polymer may be in the range of about 1.5 to about 4.

The polymer may be used in an organic light-emitting device.

According to another aspect of the present invention, there is provided an organic light-emitting device including: a first electrode; a second electrode; and an organic layer interposed between the first electrode and the second electrode, wherein the organic layer comprises at least one layer comprising the polymer above.

The organic layer may include a hole transport layer.

The organic layer may include an emission layer.

BRIEF DESCRIPTION OF THE DRAWINGS

The above and other features and advantages of the present invention will become more apparent by describing exemplary embodiments thereof with reference to the attached drawings in which.

DETAILED DESCRIPTION OF CERTAIN INVENTIVE EMBODIMENTS

Figure 1:
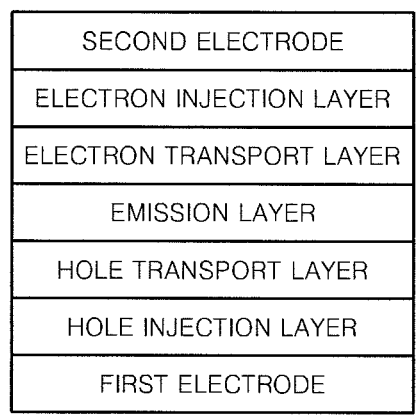
FIG. 1 is a cross-sectional view of a general organic light-emitting device.

The present invention will now be described more fully with reference to the accompanying drawings, in which exemplary embodiments of the invention are shown.

A polymer according to an embodiment may be represented by Formula 1 below:

[Formula 1]

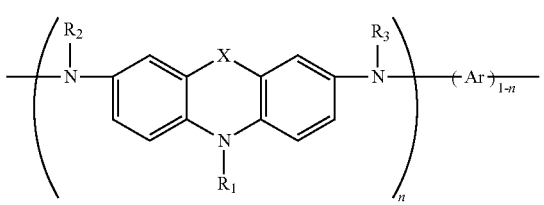

wherein, n is a real number in the range of about 0.01 to about 0.99,

X is O or S, $R_1$ is H, a linear $C_1$-$C_{20}$ alkyl group, a branched $C_1$-$C_{20}$ alkyl group, a cyclic $C_3$-$C_{20}$ alkyl group, or a $C_6$-$C_{14}$ aromatic group, wherein the aromatic group may be substituted with a $C_1$-$C_{20}$ alkyl group or a $C_1$-$C_{20}$ alkoxy group, $R_2$ and $R_3$ are each independently a $C_6$-$C_{26}$ aromatic group or a hetero aromatic group substituted with a heteroatom, wherein the aromatic group or the heteroaromatic group may be substituted with a $C_1$-$C_{20}$ alkyl group or a $C_1$-$C_{20}$ alkoxy group.

Substituents $R_1$, $R_2$, and $R_3$ in the polymer compound of Formula 1 will now be described.

In Formula 1, $R_2$ and $R_3$ may be the same with each other or $R_1$, $R_2$, and $R_3$ may be the same with each other. Hereinafter, substituents described with reference to Formula 1 will now be defined.

In Formula 1, examples of the linear or branched $C_1$-$C_{20}$ alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonanyl group, or dodecyl group. At least one hydrogen atom in the alkyl group may be substituted with a deuterium atom, a tritium atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, and a $C_4$-$C_{16}$ heteroaryl group.

In Formula 1, at least one hydrogen atom in the cyclic $C_3$-$C_{20}$ alkyl group may be substituted with the same substituent as the substituent of the linear or branched $C_1$-$C_{20}$ alkyl group.

In Formula 1, Ar may be a linear $C_1$-$C_{20}$ alkyl group, a branched $C_1$-$C_{20}$ alkyl group, a $C_6$-$C_{26}$ aromatic group, or a heteroaromatic group substituted with a heteroatom, wherein the aromatic group or the heteroaromatic group may be substituted with a $C_1$-$C_{20}$ alkyl group or a $C_1$-$C_{20}$ alkoxy group.

In Formula 1, the aromatic group refers to a carbocyclic aromatic system containing at least one ring. When the carbocyclic aromatic system includes at least two rings, the at least two rings may be fused to each other or linked to each other by a single bond. The term 'aromatic' includes an aromatic system, such as, for example, phenyl, naphthyl, or anthracenyl. At least one hydrogen atom in the aromatic group may be substituted with the same substituent as the substituent of the linear or branched $C_1$-$C_{20}$ alkyl group.

Examples of the aromatic group include, but are not limited to, a phenyl group, a $C_1$-$C_{10}$ alkylphenyl group (for example, ethylphenyl group), a halophenyl group (for example, o-, m-, and p-fluorophenyl group, dichlorophenyl group), a cyanophenyl group, dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, a o-, m-, and p-toryl group, an o-, m-, and p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, fluoronaphthyl group), a $C_1$-$C_{10}$ alkylnaphthyl group (for example, methylnaphthyl group), a $C_1$-$C_{10}$ alkoxynaphthyl group (for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

In Formula 1, the hetero aromatic group includes one, two or three hetero atoms selected from N, O, P and S. At least two rings may be fused to each other or linked to each other by a single bond. Examples of the hetero aromatic group may include a pyrazolyl group, an imidazolyl group, an oxyzolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and the like. At least one hydrogen atom in the hetero aromatic group may be substituted with the same substituent as the substituent of the linear or branched $C_1$-$C_{20}$ alkyl group.

The alkoxy group used herein is a group having a structure of —OA, wherein A is a linear or branched $C_1$-$C_{20}$ alkyl group as described above. Examples thereof may include, but are not limited to, a methoxy group, an ethoxy group, a propoxy group, an isopropyloxy group, a butoxy group, and a pentoxy group. At least one hydrogen atom of the alkoxy group may be substituted with the same substituent groups as described above in connection with the alkyl groups.

Ar may be one of the groups represented by Formula 2 below:

[Formula 2]

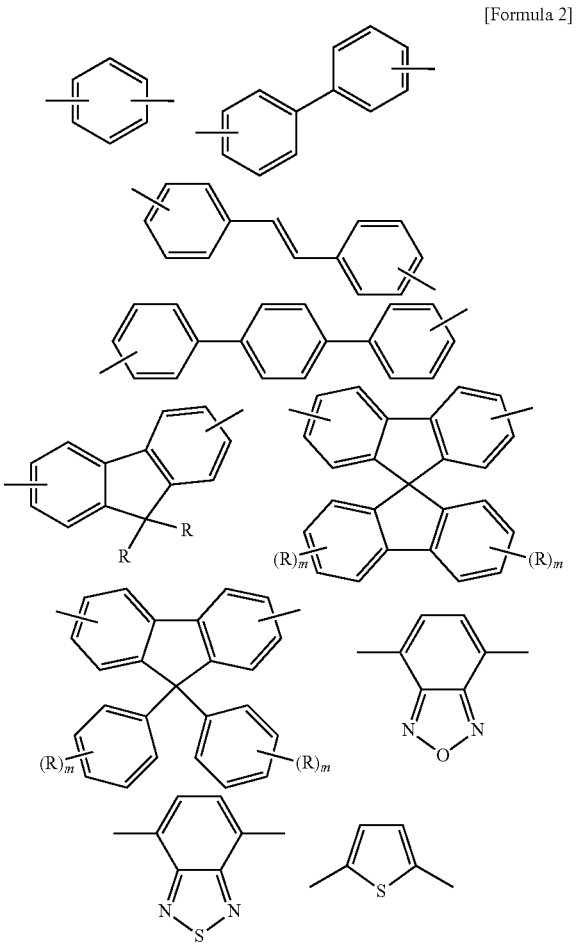

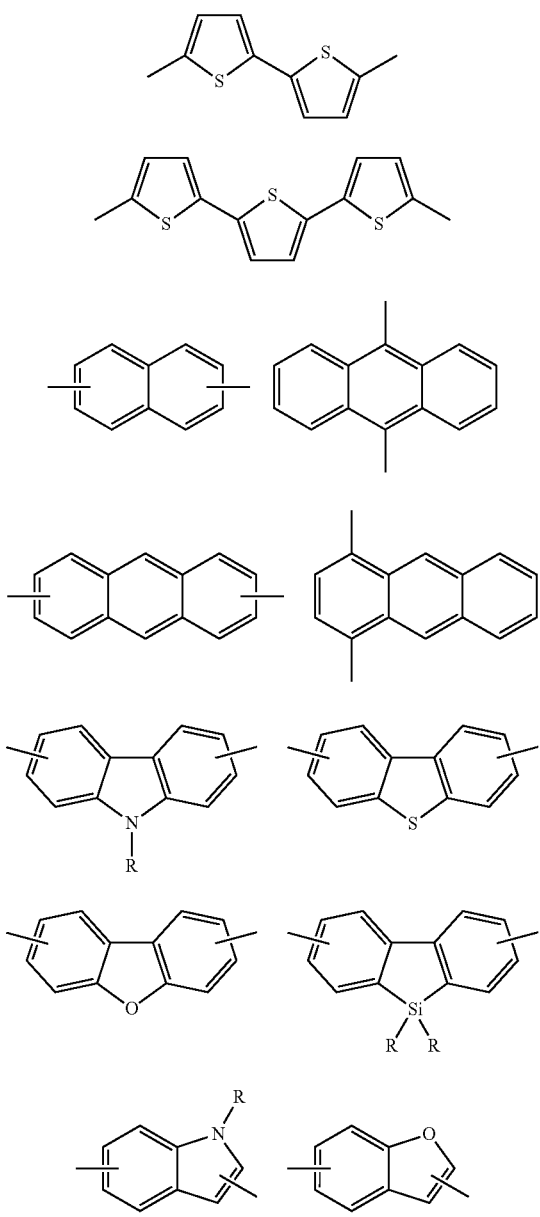

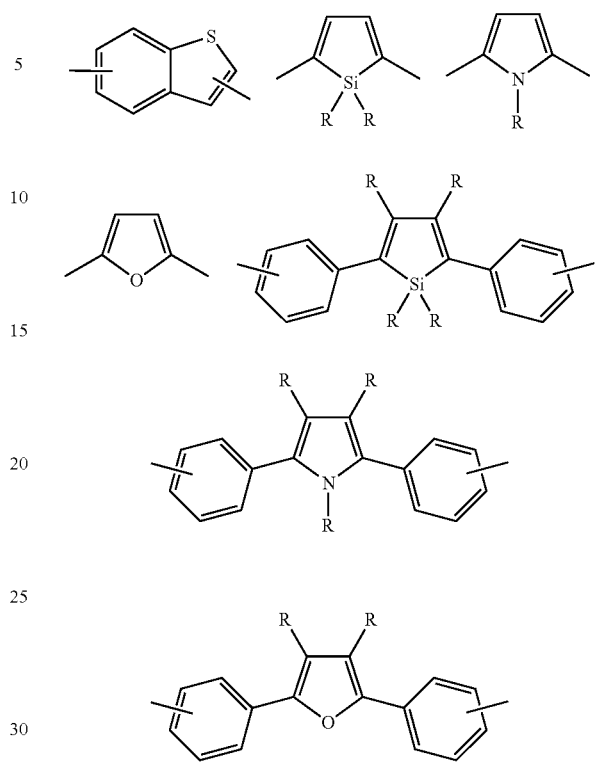

In Formula 2, m is a positive number from about 1 to about 4 and R is a $C_1$-$C_{20}$ alkyl group.

According to an embodiment, $R_1$, $R_2$, and $R_3$ may each independently a phenyl group, weight-average molecular weight of the polymer may be from about 10,000 to about 300,000, and molecular weight dispersion of the polymer may be from about 1.5 to about 4.

When the weight-average molecular weight and the molecular weight dispersion are within the above range, processability is excellent, thereby facilitating an operation and resulting in excellent performance.

In some embodiments, the polymer compound may be represented by one of Formulae 3 through 9 below:

[Formula 3]

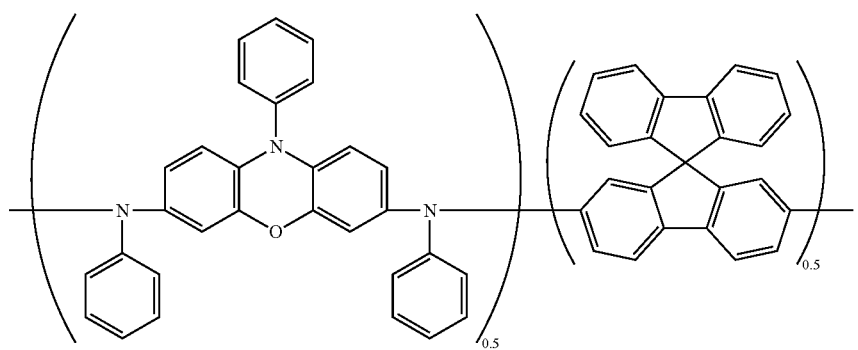

-continued
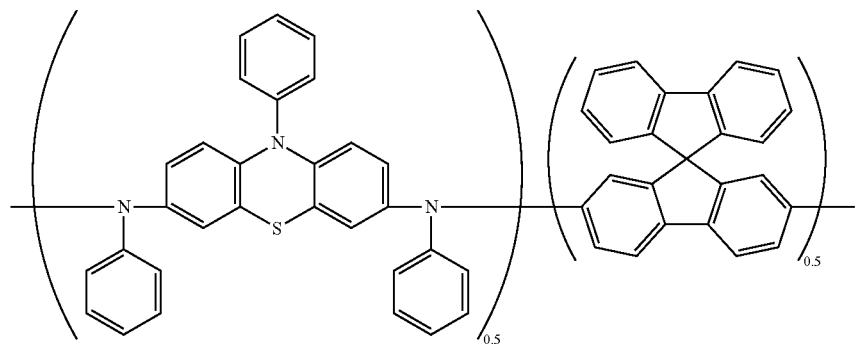
[Formula 4]
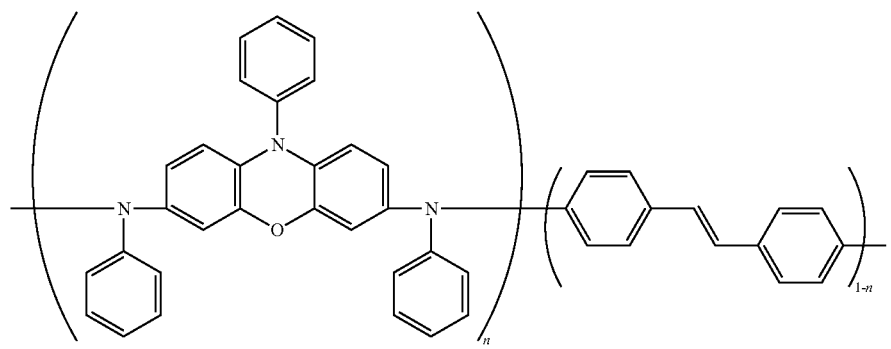
[Formula 5]
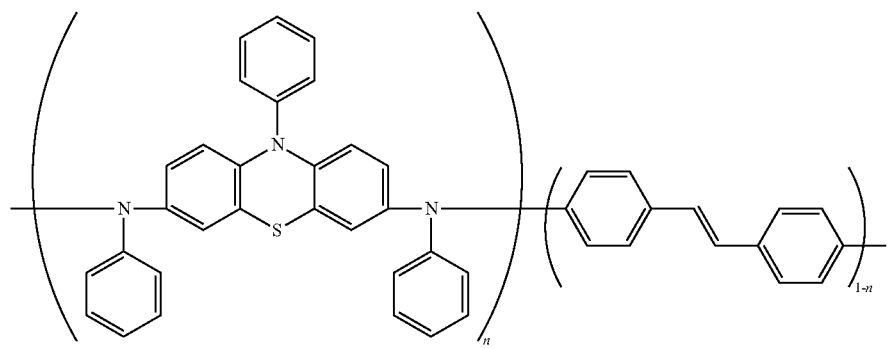
[Formula 6]
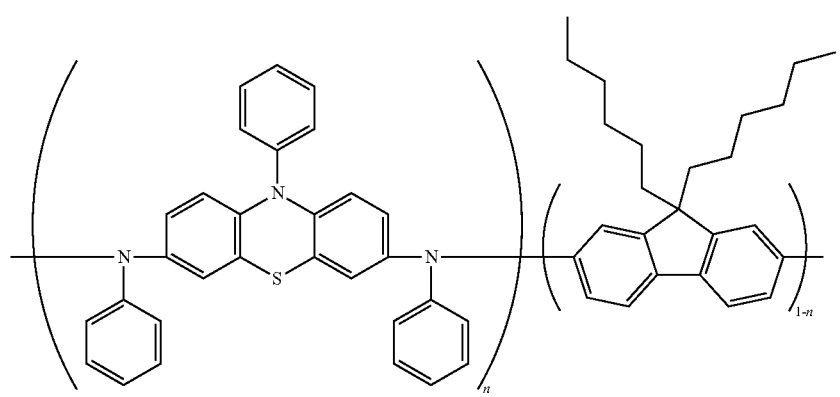
[Formula 7]

[Formula 8]

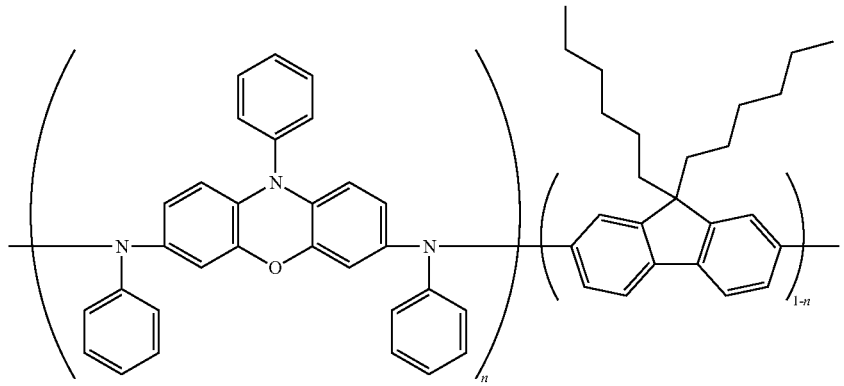

[Formula 9]

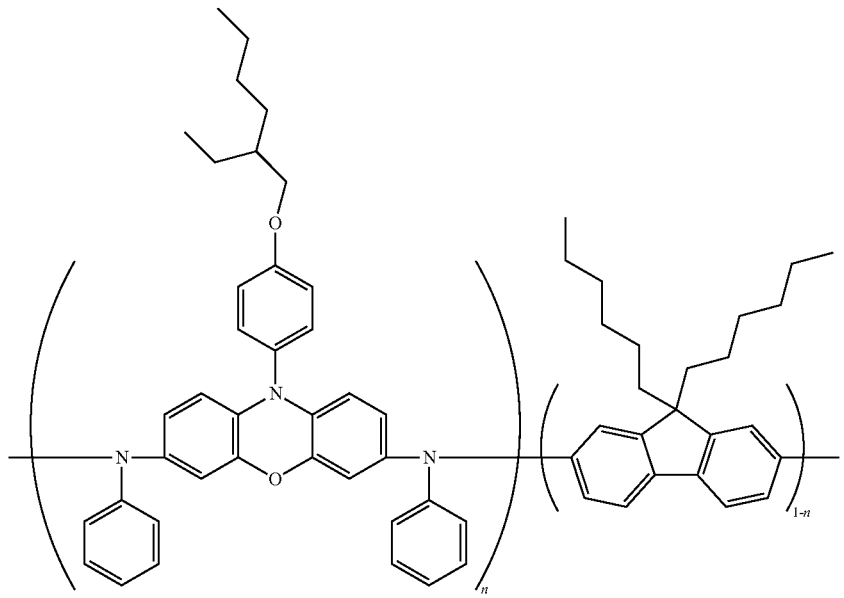

n is as described above.

The polymer according to some embodiments includes an amine group directly connected to phenoxazine in a main chain. The polymer according to an embodiment is stable and has excellent hole transport capability due to the amine group. Accordingly, the polymer may be efficiently used in an organic light-emitting device.

An organic light-emitting device according to an embodiment includes a first electrode, a second electrode, and an organic layer disposed between the first electrode and the second electrode, the organic layer including the polymer of Formula 1 described above.

The organic layer including the polymer of Formula 1 may be a hole transport layer or an emission layer.

The first electrode may be an anode and the second electrode may be a cathode, but the reverse is also possible.

Hereinafter, a method of manufacturing a general organic light-emitting device of FIG. 1 will be described. FIG. 1 illustrates a structure of a general organic light-emitting device. Referring to FIG. 1, the general organic light-emitting device includes a substrate, a first electrode (e.g., anode), a hole injection layer (HIL), a hole transport layer (HTL), an emission layer (EML), an electron transport layer (ETL), an electron injection layer (EIL), and a second electrode (e.g., cathode).

First, the first electrode is formed on the substrate by using a deposition or sputtering method. The first electrode may comprise a first electrode material having a high work function. The first electrode may be an anode or a cathode. The substrate may be a substrate generally used in organic light-emitting devices, and may include, for example, a glass substrate or a transparent plastic substrate, which has excellent mechanical strength, thermal stability, transparency, surface planarity, handling convenience, and water resistance. Examples of the first electrode material may include materials, such as indium tin oxide (ITO), indium zinc oxide (IZO), tin oxide ($SnO_2$), zinc oxide (ZnO), aluminum (Al), silver (Ag), and magnesium (Mg), which have excellent conductivity, and may form a transparent or reflective electrode.

Then, a HIL may be formed on the first electrode by using spin coating, casting, Langmuir Blodgett (LB) deposition, or the like.

When the HIL is formed using spin coating, coating conditions may vary according to a compound that is used to form the HIL, and the structure and thermal properties of the HIL to be formed. For example, the coating conditions may include a coating speed of about 1000 rpm to about 5000 rpm, and a thermal treatment temperature of about 80° C. to about 250° C., wherein the thermal treatment is for removing a solvent after coating.

The HIL may comprise any material that is commonly used to form a HIL. Examples of the material that can be used to form the HIL may include a phthalocyanine compound such as copperphthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS), but are not limited thereto.

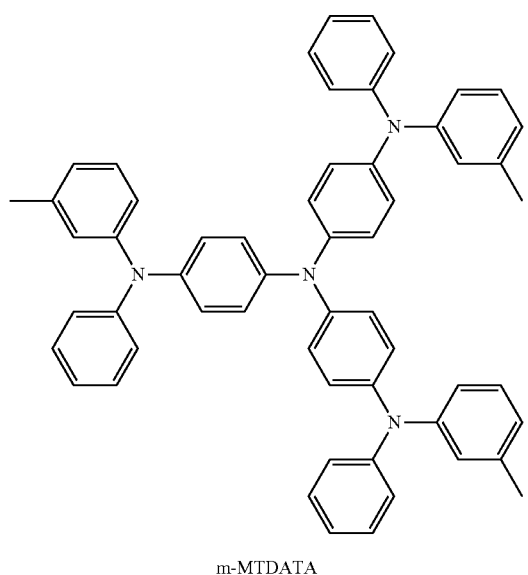

m-MTDATA

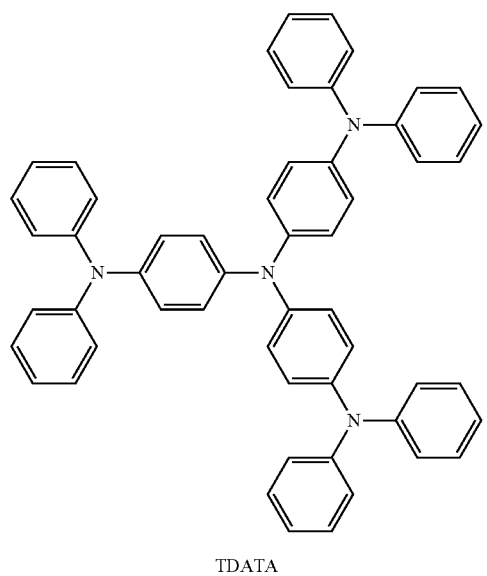

TDATA

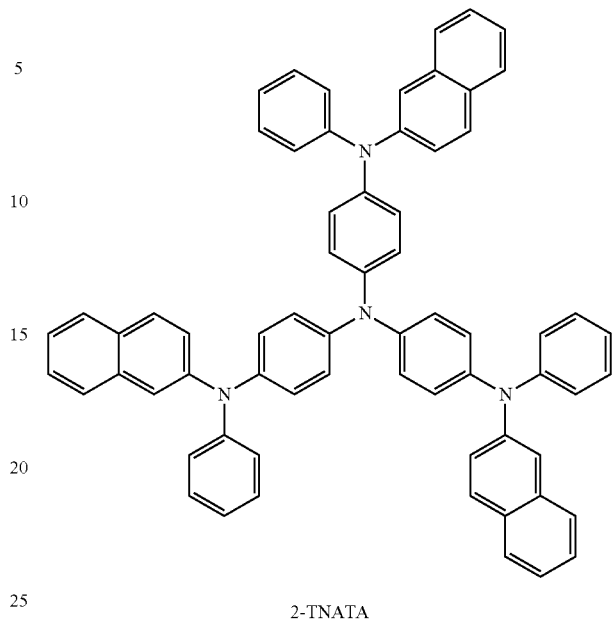

2-TNATA

The HIL may have a thickness of about 100 Å to about 10000 Å, in some embodiments, the HIL may have a thickness of about 100 Å to about 1000 Å. When the thickness of the HIL is within the above range, the HIL may have excellent hole injection characteristics without an increase in a driving voltage.

Then a HTL may be formed on the HIL by using spin coating, casting, Langmuir-Blodgett (LB) deposition, or the like. When the HTL is formed using spin coating, the conditions for deposition and coating are similar to those for the formation of the HIL, though the conditions for the deposition and coating may vary according to the material that is used to form the HTL.

The HTL material may include the polymer of Formula 1 described above. Alternatively, a well-known HTL material may be used together with the polymer of Formula 1. Examples of the HTL materials may include, but are not limited to, cabazol derivatives such as N-phenylcarbazol or polyvinylcarbazol, and amine derivatives having an aromatic condensed ring, such as NPB, N,N'-bis(3-methylphenyl)-N,N'-diphenyl-[1,1-biphenyl]-4,4'-diamine (TPD), or N,N'-di(naphthalene-1-yl)

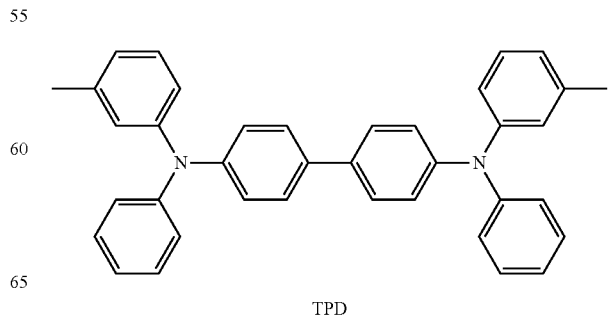

TPD

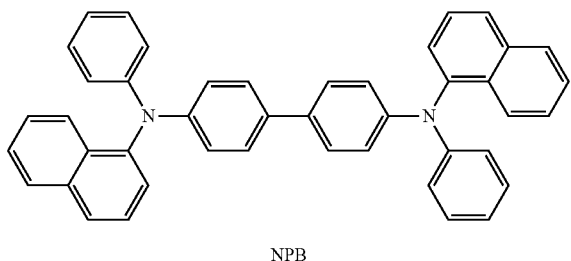

NPB

The HTL may have a thickness of about 50 Å to about 1000 Å, in some embodiments, the HTL may have a thickness of 100 Å to about 600 Å. When the thickness of the HTL is within the above range, the HTL may have excellent hole transport characteristics without a substantial increase in a driving voltage.

Then, an EML may be formed on the HTL by using spin coating, casting, LB, or the like. When the EML is formed using spin coating, the conditions for deposition are similar to those for the formation of the HIL, although the conditions for deposition may vary according to the material that is used to form the EML.

The EML may include the polymer represented by Formula 1 described above. For example, the polymer represented by Formula 1 may be used as a host or a dopant in a blue EML. The EML may be formed using a variety of well-known light-emitting materials in addition to the polymer represented by Formula 1, and may also be formed using a well-known host and a dopant. Dopants used to form the EML may include either a fluorescent dopant or a phosphorescent dopant, which are widely known in the art.

Examples of the host may include, but are not limited to, $Alq_3$, 4,4'-N,N'-dicarbazole-biphenyl (CPB), 9,10-di(naphthalene-2-yl)anthracene (ADN), and distyrylarylene (DSA).

Examples of well-known red dopants may include, but are not limited to, platinum(II) octaethylporphyrin (PtOEP), $Ir(piq)_3$, $Btp_2Ir(acac)$, and DCJTB.

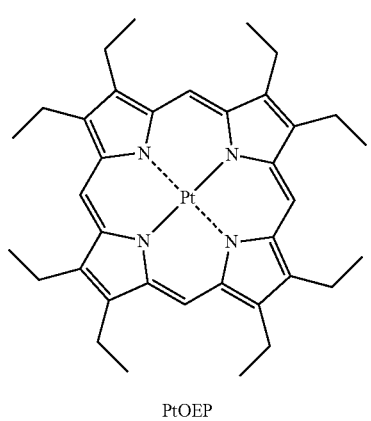

PtOEP

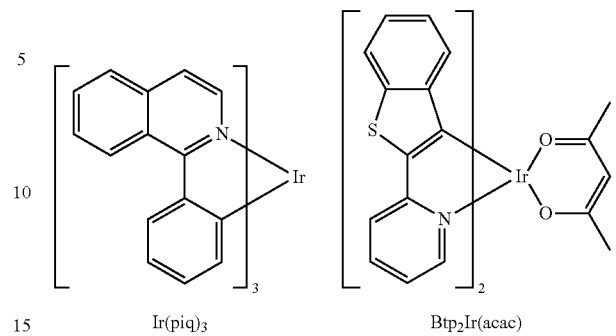

$Ir(piq)_3$      $Btp_2Ir(acac)$

Examples of well-known green dopants may include, but are not limited to, $Ir(ppy)_3$ (where "ppy" denotes phenylpyridine), $Ir(ppy)_2(acac)$, $Ir(mpyp)_3$, and C545T.

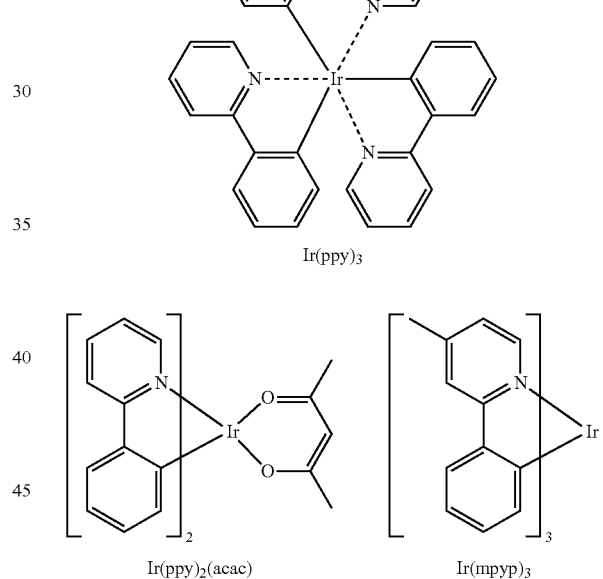

$Ir(ppy)_3$ $Ir(ppy)_2(acac)$      $Ir(mpyp)_3$

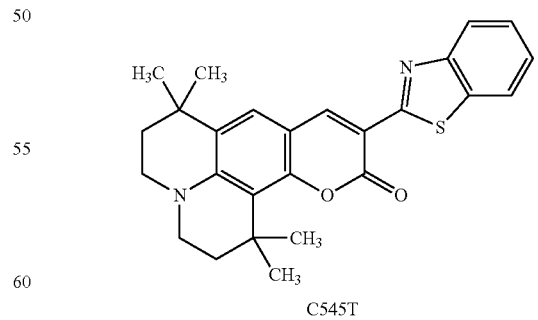

C545T

Examples of well-known blue dopants may include, but are not limited to, $F_2Irpic$, $(F_2ppy)_2Ir(tmd)$, $Ir(dfppz)_3$, ter-fluorene, 4,4'-bis(4-diphenylaminostyryl)biphenyl (DPAVBi), and 2,5,8,11-tetra-t-butyl pherylene (TBP).

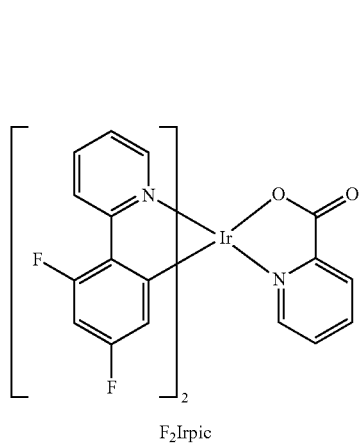

F₂Irpic

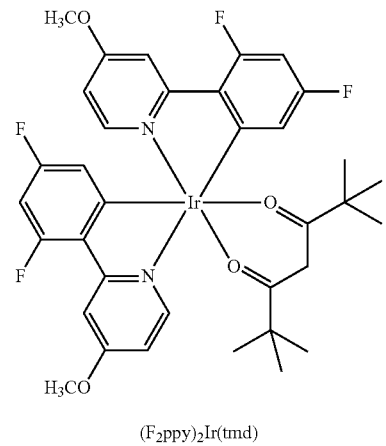

(F₂ppy)₂Ir(tmd)

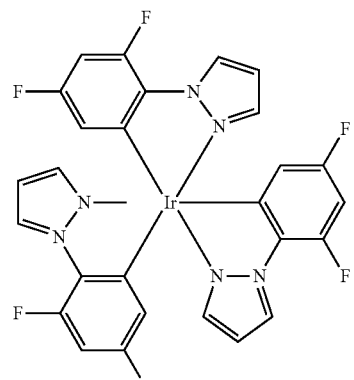

Ir(dfppz)₃

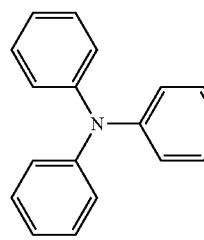

DPAVBi

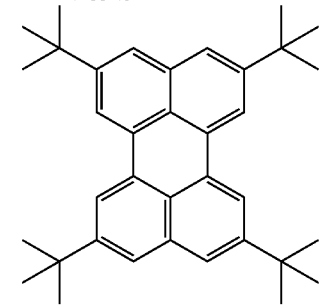

TBP

The amount of the dopant may be about 0.1 to about 20 parts by weight; in some embodiments the dopant may be about 0.5 to about 12 parts by weight, based on 100 parts by weight of the EML material, which is equivalent to the total weight of the host and the dopant. When the amount of the dopant is within the above range, concentration quenching may be substantially prevented.

The EML may have a thickness of about 100 Å to about 1000 Å; in some embodiments, the EML may have a thickness of about 200 Å to about 600 Å. When the thickness of the EML is within the above range, the EML may have excellent light-emitting characteristics without a substantial increase in a driving voltage.

When the EML includes a phosphorescent dopant, a hole blocking layer (HBL, not shown in FIG. 1) may be formed on the EML in order to prevent diffusion of triplet excitons or holes into the ETL. In this case, the HBL may be comprise any material that is commonly used to form a HBL. Examples of such HBL materials may include, but are not limited to, oxadiazole derivatives, triazole derivatives, phenathroline derivatives, Balq, and BCP.

The HBL may have a thickness of about 50 Å to about 1,000 Å; in some embodiments the HBL may have a thickness of about 100 Å to about 300 Å. When the thickness of the HBL is less than about 50 Å, hole blocking characteristics may be degraded. On the other hand, when the thickness of the HBL is greater than about 1000 Å, the driving voltage of the organic light emitting device may be increased.

Then an ETL may be formed on the HBL or EML by using spin coating, casting, or the like. When the ETL is formed using spin coating, the deposition or coating conditions may be similar to those used to form the HIL, though the deposition and coating conditions may vary according to the material that is used to form the ETL.

The ETL material may include the heterocyclic compound of Formula 1 described above. Alternatively, the ETL may comprise any material that is widely known in the art. Examples of the ETL material may include, but are not limited to, quinoline derivatives, such as tris(8-quinolinolate) aluminum (Alq₃), TAZ, and Balq.

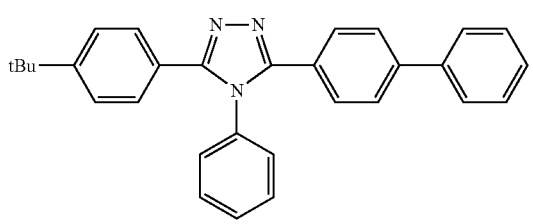

TAZ

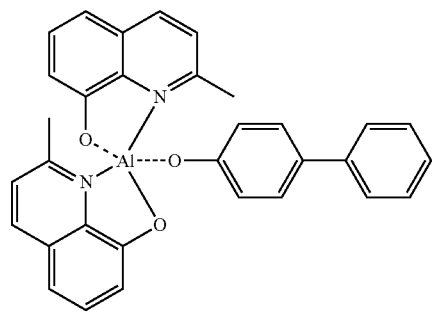

BAlq

The ETL may have a thickness of about 100 Å to about 1000 Å; in some embodiments, the ETL may have a thickness of about 100 Å to about 500 Å. When the ETL has a thickness within the above range, the ETL may have excellent electron transport characteristics without a substantial increase in a driving voltage.

In addition, the EIL, which facilitates injection of electrons from the cathode, may be formed on the ETL.

An EIL material may include the heterocyclic compound of Formula 1 described above. Alternatively, well-known EIL materials, such as LiF, NaCl, CsF, $Li_2O$, or BaO, may be used to form the EIL. The deposition or coating conditions for forming the EIL may be similar to those applied to form the HIL, although the deposition and coating conditions may vary according to the material that is used to form the EIL.

The EIL may have a thickness of about 1 Å to about 100 Å; in some embodiments, the EIL may have a thickness of about 5 Å to about 90 Å. When the EIL has a thickness within the above range, the EIL may have excellent electron injection characteristics without a substantial increase in a driving voltage.

Finally, the second electrode may be formed on the EIL using, for example, vacuum deposition, sputtering, or the like. The second electrode may constitute a cathode or an anode. A second electrode material may include a metal, an alloy, an electrically conductive compound, or mixtures thereof, all of which have a low work function. Examples of such materials may include, but are not limited to, lithium (Li), magnesium (Mg), aluminum (Al), aluminum-lithium (Al—Li), calcium (Ca), magnesium-indium (Mg—In), and magnesium-silver (Mg—Ag). In addition, in order to manufacture a top-emission organic light-emitting device, a transparent cathode comprising a transparent material such as ITO or IZO may be used as the second electrode.

The organic light-emitting device according to the current embodiment may be included in various types of flat panel display devices, such as in a passive matrix organic light-emitting display device or in an active matrix organic light-emitting display device. In particular, when the organic light-emitting device is included in an active matrix organic light-emitting display device including a thin-film transistor, the first electrode on the substrate may function as a pixel electrode electrically connected to a source electrode or a drain electrode of the thin-film transistor. Moreover, the organic light-emitting device may also be included in a flat panel display device having a double-sided screen.

Hereinafter, synthesis examples and Examples of the polymers represented by Formulae 3 and 4 will be described. However, the present invention is not limited to the Examples below.

Synthesis of Monomer

Synthesis of Phenoxazine Monomer C

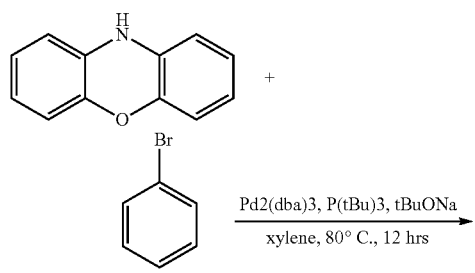

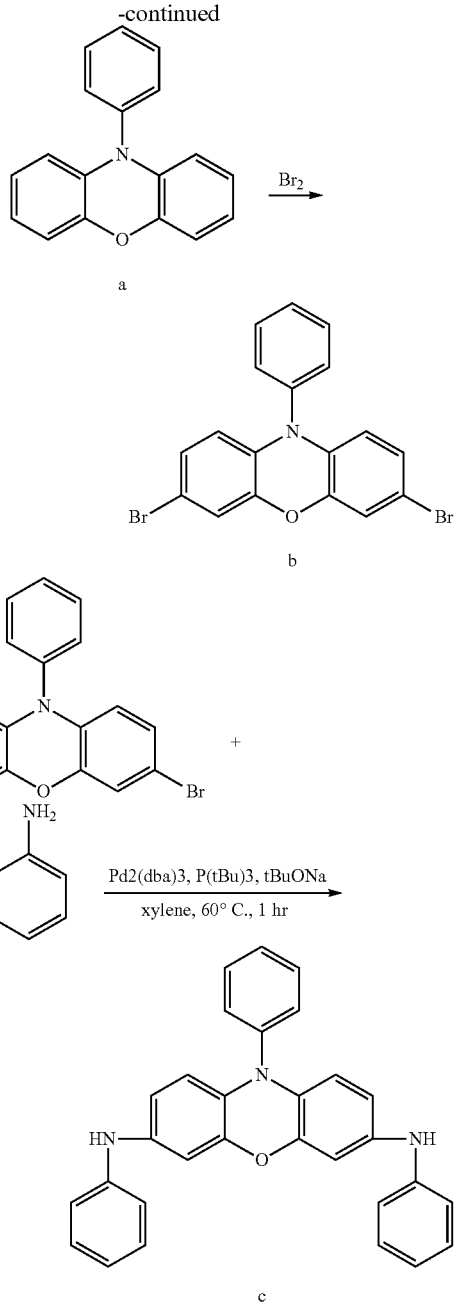

1) Synthesis of Compound a 10 g (54 mmol) of phenoxazine, 7.4 g (77 mmol) of sodium tert-butoxide, 0.61 g (1.1 mmol) of $Pd_2(dba)_3$ [(tris(dibenzylidine acetone) dipalladium(0))], and 0.22 g (1.1 mmol) of tri(tert-butyl)phosphine were dissolved in 200 mL of xylene, and then refluxed at 80° C. for 12 hours.

After completion of the reaction, the reaction mixture was cooled to room temperature and then extracted by adding 200 mL of distilled water in a volume ratio of xylene to water of 1:1. The organic phase was collected, dried using $MgSO_4$, and then concentrated. The concentrated product was refined using silica gel column chromatography in which a mixture of toluene and hexane in a volume ratio of 1:2 was used as an eluant. Then, the resulting effluent was concentrated and dried to obtain 15.2 g of Compound with a yield of 71%.

2) Synthesis of Compound b 15 g (57.8 mmol) of compound a was dissolved in 200 mL of CHCl₃ to obtain a dissolved solution and 18.5 g of bromine (Br) 2 equivalent was slowly added to the dissolved solution while maintaining the dissolved solution at 0° C. The mixture was stirred for about 40 minutes and the reaction was stopped.

A small amount of acetone was added to the reaction mixture and then extracted by using water and CHCl₃ in a volume ratio of 2:1 after quenching bromine Br. The organic phase was collected, dried using MgSO₄, and then concentrated. The concentrated product was reprecipitated in MeOH to obtain 17 g of Compound b with a yield of 70.5%.

3) Synthesis of Compound c 17 g (41 mmol) of Compound b, 7.6 g (82 mmol) of aniline, 7.4 g (77 mmol) of sodium tert-butoxide, 0.61 g (1.1 mmol) of Pd₂(dba)₃ [(tris(dibenzylidine acetone) dipalladium(0))], and 0.22 g (1.1 mmol) of tri(tert-butyl)phosphine were dissolved in 200 mL of xylene, and then refluxed at 60° C. for 1 hour.

After completion of the reaction, the reaction mixture was cooled to room temperature and then extracted by adding 200 mL of distilled water in a volume ratio of xylene to water of 1:1. The organic phase was collected, dried using MgSO₄, and then concentrated. The concentrated product was refined using silica gel column chromatography in which a mixture of toluene and hexane in a volume ratio of 1:1 was used as an eluant. Then, the resulting effluent was concentrated and dried to obtain 8 g of Compound c with a yield of 44.2%.

1H-NMR (300 MHz, CDCl₃): δ4.08 (s, 2H), 65.87~7.01 (m, 20H)

A phenothiazine monomer d may be also manufactured as in the method above.

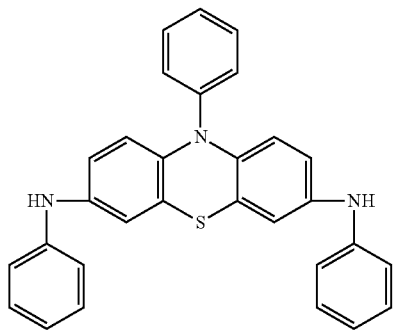

d

Synthesis of Polymer

Synthesis of Polymer of Formula 3

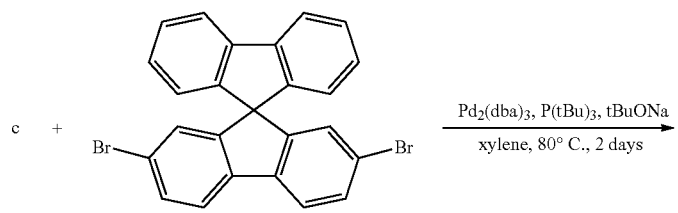

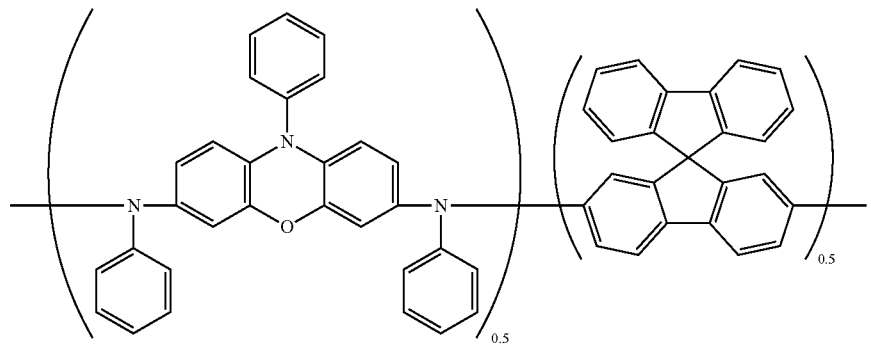

8 g (18 mmol) of Compound c, 8.5 g (18 mmol) of 2,7-dibromo spirofluorene, 7.4 g (77 mmol) of sodium tert-butoxide, 0.61 g (1.1 mmol) of Pd₂(dba)₃ [(tris(dibenzylidine acetone) dipalladium(0))], and 0.22 g (1.1 mmol) of tri(tert-butyl)phosphine were dissolved in 200 mL of xylene, and then refluxed at 80° C. for 2 days.

After completion of the reaction, the reaction mixture was cooled to room temperature and then extracted by adding 200 mL of distilled water in a volume ratio of xylene to water of 1:1. The organic phase was collected, dried using MgSO₄, and then concentrated. The concentrated product was refined using silica gel column chromatography in which toluene was used as an eluant. Then, the resulting effluent was dissolved in toluene and precipitated in 4 L of MeOH. The precipitated resultant was washed, dried under reduced pressure, and precipitated in toluene/MeOH three times. Accordingly, 8.8 g of the polymer represented by Formula 3 was obtained in the form of a light yellow solid.

The resulting polymer was analyzed using gas permeation chromatography (GPC). As a result, the polymer had a weight-average molecular weight (Mw) of 38,000, and a molecular weight dispersion of 2.8.

Synthesis of Polymer of Formula 4

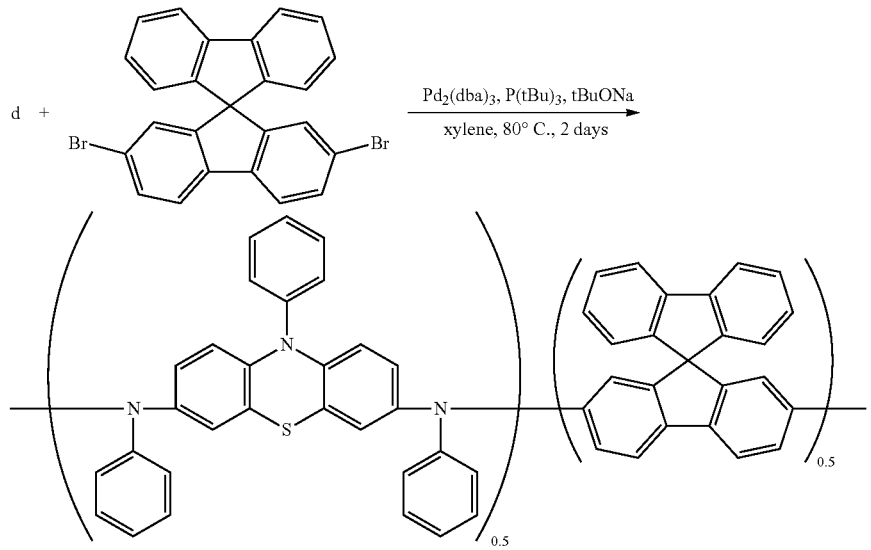

5 g (11 mmol) of Compound d, 5.2 g (11 mmol) of 2,7-dibromo spirofluorene, 5.4 g (60 mmol) of sodium tert-butoxide, 0.61 g (1.1 mmol) of Pd$_2$(dba)$_3$ [(tris(dibenzylidine acetone) dipalladium(0))], and 0.22 g (1.1 mmol) of tri(tert-butyl)phosphine were dissolved in 150 mL of xylene, and then refluxed at 80° C. for 2 days.

After completion of the reaction, the reaction mixture was cooled to room temperature and then extracted by adding 200 mL of distilled water in a volume ratio of xylene to water of 1:1. The organic phase was collected, dried using MgSO$_4$, and then concentrated. The concentrated product was refined using silica gel column chromatography in which toluene was used as an eluant. The resulting effluent was precipitated by adding 800 mL of ethanol. An organic material obtained as above was condensed, dissolved in 100 mL of THF, and precipitated in 2 L of MeOH. The precipitated resultant was washed, dried under reduced pressure, and precipitated in toluene/MeOH three times. Accordingly, 3.1 g of the polymer represented by Formula 4 was obtained in the form of a light yellow solid.

The resulting polymer was analyzed using gas permeation chromatography (GPC). As a result, the polymer had a weight-average molecular weight (Mw) of 40,000, and a molecular weight dispersion of 3.2.

Example 1

Figure 3:
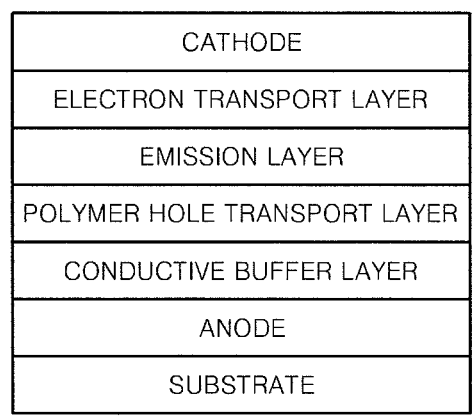
FIG. 3 is a cross-sectional view of an organic light-emitting device of Example 1.

An organic light emitting device was manufactured as in FIG. 3. A 15 Ω/cm$^2$ (1,200 Å) ITO glass substrate (available from Corning Co.) was cut to a size of 50 mm×50 mm×0.5 mm, ultrasonically washed with isopropyl alcohol for 5 minutes and then with pure water for 5 minutes, and washed again with UV ozone for 20 minutes. Then, CH8000 from H.C. Stark Co. as a conductive buffer layer was coated to a thickness of about 600 Å on the ITO film and then baked for about 20 minutes at 200° C. Then, 3 mg of the polymer of Formula 3 manufactured as above was dissolved in 1 ml of toluene to obtain a polymer solution and the polymer solution was filtered by using a 0.2 µm filter before being spin coated. The filtered polymer solution was spin coated on the buffer layer and then baked for about 10 minutes at 200° C., thereby forming a polymer HTL. The formed polymer HTL had a thickness of about 300 Å by adjusting concentration and spin speed of the polymer solution. After the HTL was formed, DSA as a phosphorescent host and 3% of TBPe as a dopant were used and vacuum deposited, thereby forming an EML having a thickness of about 300 Å. Then, Alq3 was vacuum deposited on the EML to form an ETL having a thickness of about 200 Å. LiF having a thickness of about 80 Å and Al having a thickness of about 3000 Å were sequentially vacuum deposited on the ETL to form a LiF/Al electrode. A crystal sensor was used in regulating a thickness of the layer and growing speed of the layer during deposition.

Example 2

An organic light emitting device was manufactured in the same manner as in Example 1, except that the polymer represented by Formula 4 was used as a HTL.

Comparative Example 1

Figure 2:
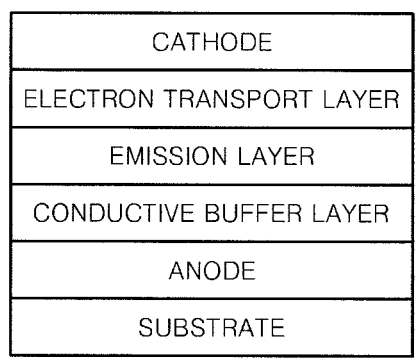
FIG. 2 is a cross-sectional view of an organic light-emitting device of Comparative Example 1.

An organic light emitting device was manufactured as in FIG. 2. The organic light emitting device was manufactured in the same manner as in Example 1, except that the HTL was not formed.

Comparative Example 2

An organic light emitting device was manufactured in the same manner as in Example 1, except that the polymer represented by Formula 10 was used as a HTL.

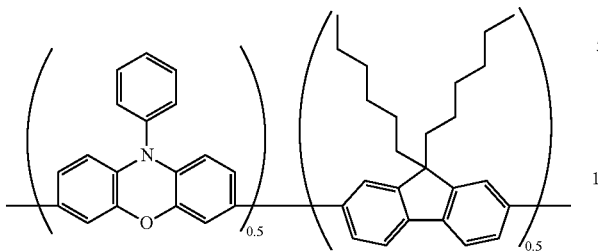

[Formula 10]

Current density (mA/cm2), driving voltage (V), brightness (cd/m2), and luminescent efficiency (cd/A) of each of the organic light-emitting devices of Examples and Comparative Examples were measured by using a PR650 (Spectroscan) Source Measurement Unit and a half lifetime (cd/m$^2$) thereof was also measured (Mc Science Co.). The results are shown in Table 1 below.

TABLE 1

|  | Luminescent efficiency (cd/A) | half lifetime (cd/m$^2$) |
| --- | --- | --- |
| Example 1 (Formula 3) | 5.15 | 1500 |
| Example 2 (Formula 4) | 4.88 | 2500 |
| Comparative Example 1 | 1.86 | 13 |
| Comparative Example 2 | 2.50 | 800 |

Referring to Table 1, an interlayer is not disposed on the buffer layer in the organic light emitting device of Comparative Example 1. Thus, the organic light emitting device of Comparative Example 1 has low luminescent efficiency and reduced lifetime compared with the organic light emitting devices of Example 1 and Comparative Example 2 which have an interlayer. Accordingly, the interlayer is required.

The polymer compound (Example 1) including an arylamine group in phenoxazine has excellent hole transport capability and high stability, compared with the phenoxazine polymer (Comparative Example 2) without an arylamine group, and thus have excellent efficiency and long lifetime.

Phenoxazine or phenothiazine used herein has great charge mobility and energy gap and thus may improve performance of the organic light-emitting device as a material for forming the blue EML, HIL, HTL, ETL, or EIL.

In particular, aryl amine is included at both sides of the phenoxazine monomer so as to improve hole mobility and thus is excellent as a material for forming an HTL.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer represented by Formula 1 below:

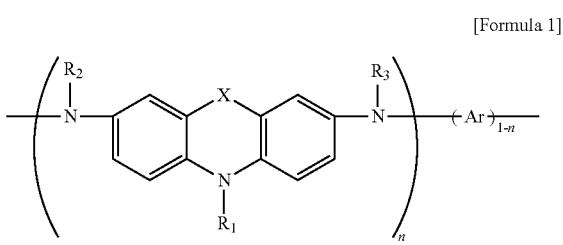

[Formula 1]

wherein, n is a real number in the range of about 0.01 to about 0.99,

X is O or S, $R_1$ is H, a linear $C_1$-$C_{20}$ alkyl group, a branched $C_1$-$C_{20}$ alkyl group, a cyclic $C_3$-$C_{20}$ alkyl group, or a $C_6$-$C_{14}$ aromatic group, wherein the aromatic group may be substituted with a $C_1$-$C_{20}$ alkyl group or a $C_1$-$C_{20}$ alkoxy group, $R_2$ and $R_3$ are each independently a hetero aromatic group substituted with a heteroatom or a $C_6$-$C_{26}$ aromatic group, wherein the aromatic group or the heteroaromatic group may be substituted with a $C_1$-$C_{20}$ alkyl group or a $C_1$-$C_{20}$ alkoxy group, and Ar is a hetero aromatic group substituted with a heteroatom linear $C_1$-$C_{20}$ alkyl group, a branched $C_1$-$C_{20}$ alkylene group, or a $C_6$-$C_{26}$ aromatic group, wherein the aromatic group or the heteroaromatic group is substituted with a $C_1$-$C_{20}$ alkyl group or a $C_1$-$C_{20}$ alkoxy group.

2. The polymer of claim 1, wherein Ar is one of the groups represented below:

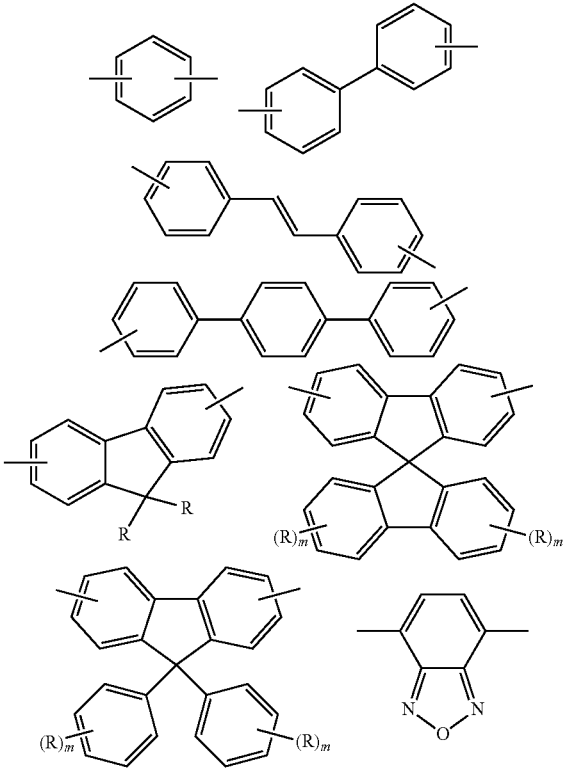

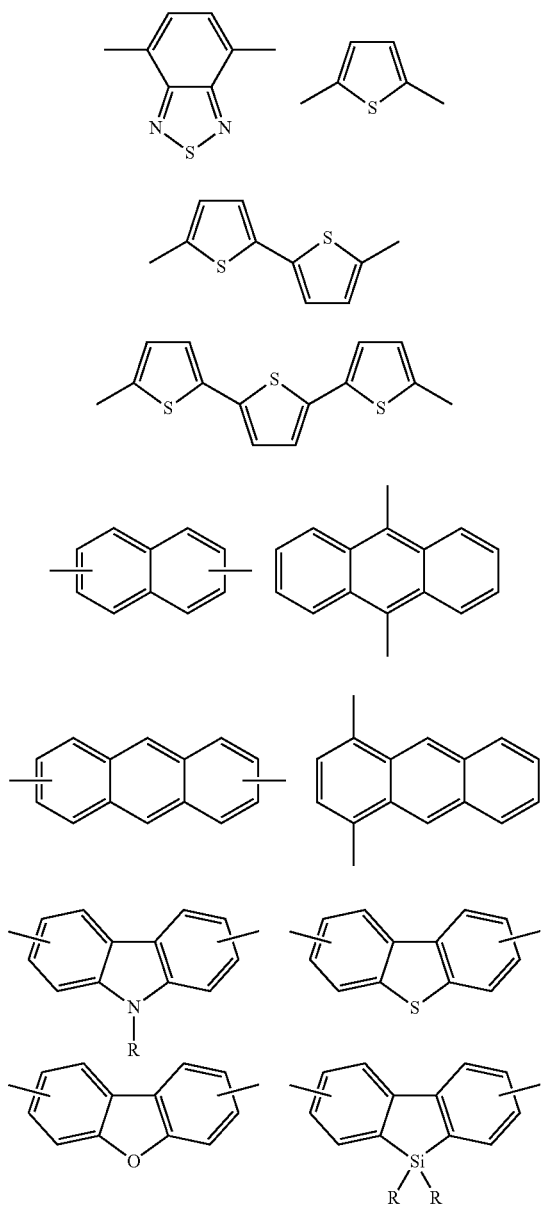
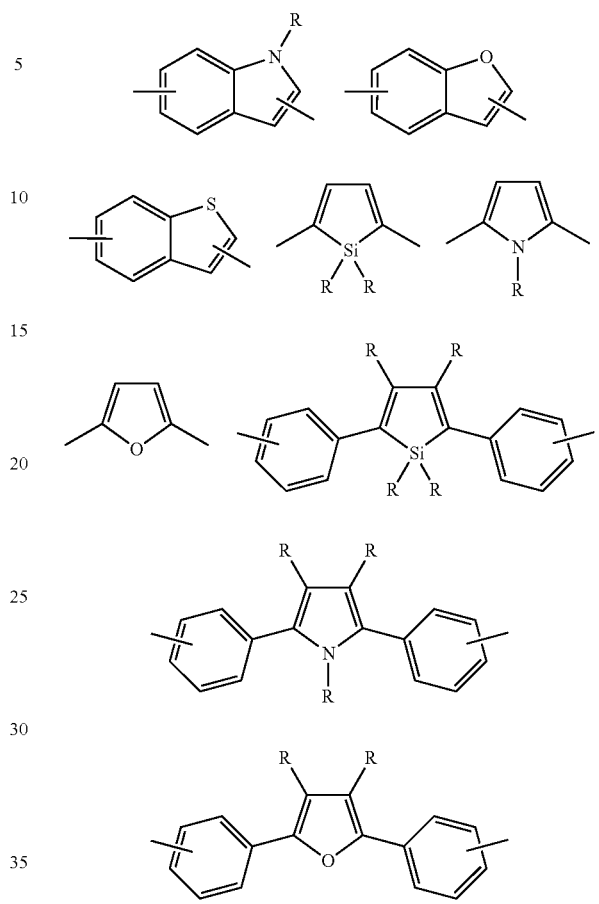
wherein, m is a positive number from about 1 to about 4 and R is a $C_1$-$C_{20}$ alkyl group.
3. The polymer of claim 1, wherein $R_1$, $R_2$, and $R_3$ are each independently a phenyl group.
4. The polymer of claim 1, wherein weight-average molecular weight of the polymer is from about 10,000 to about 300,000.
5. The polymer of claim 1, wherein the polymer is represented by one of Formulae 3 through 9 below:
[Formula 3]
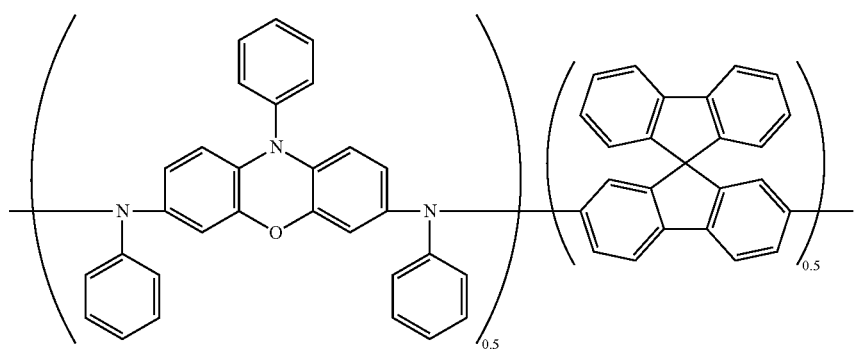

[Formula 4]
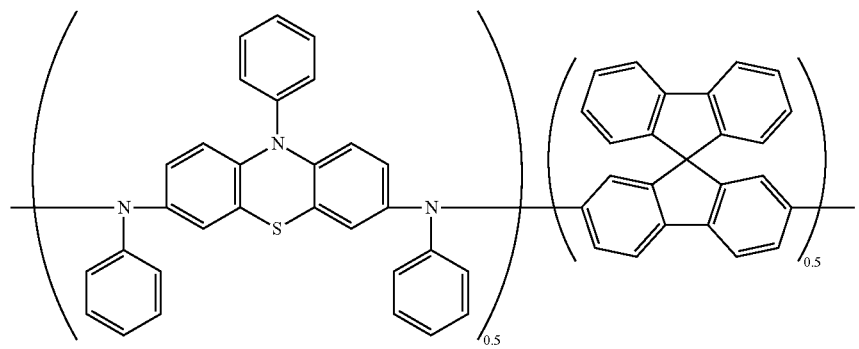
[Formula 5]
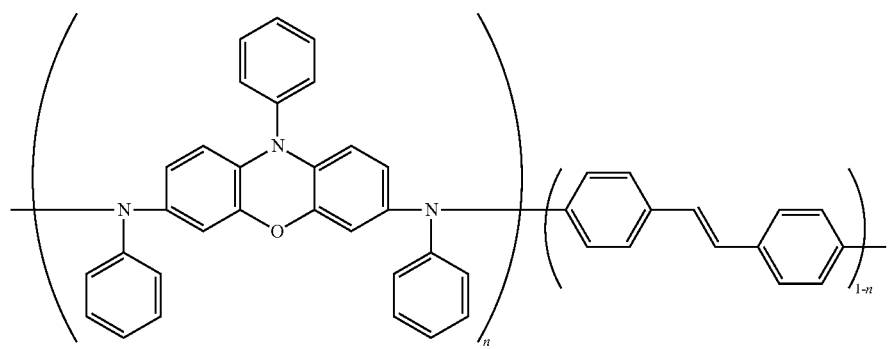
[Formula 6]
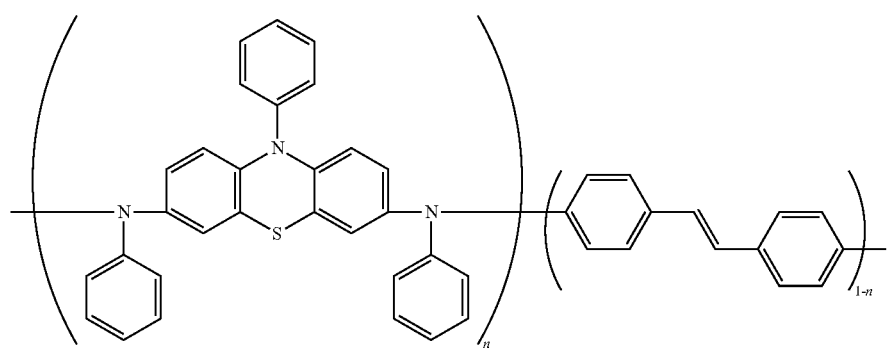
[Formula 7]
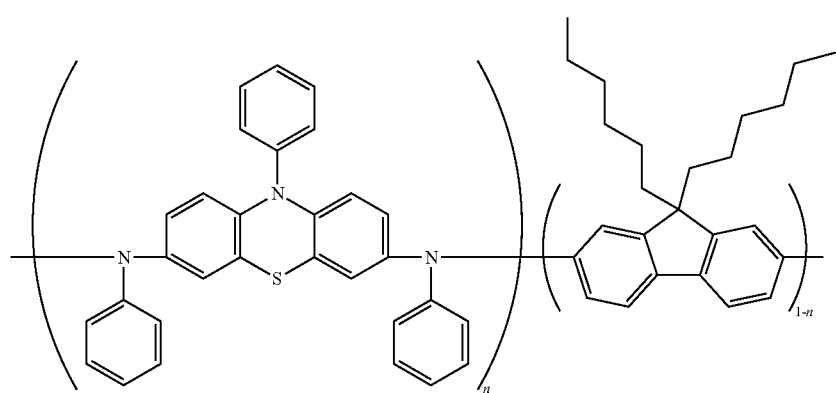

-continued

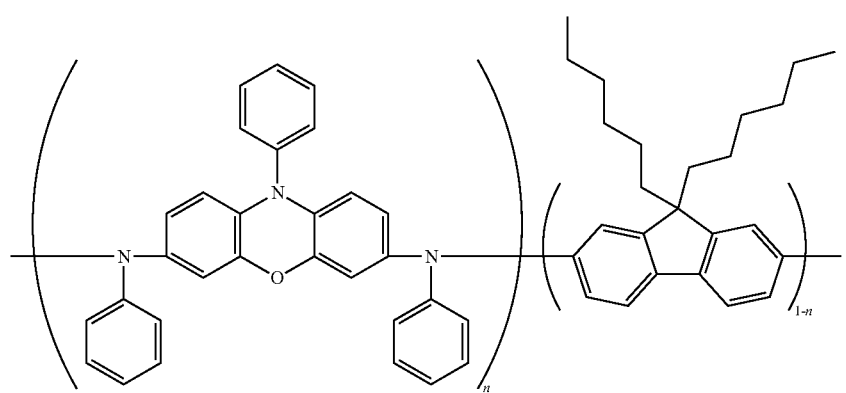
[Formula 8]

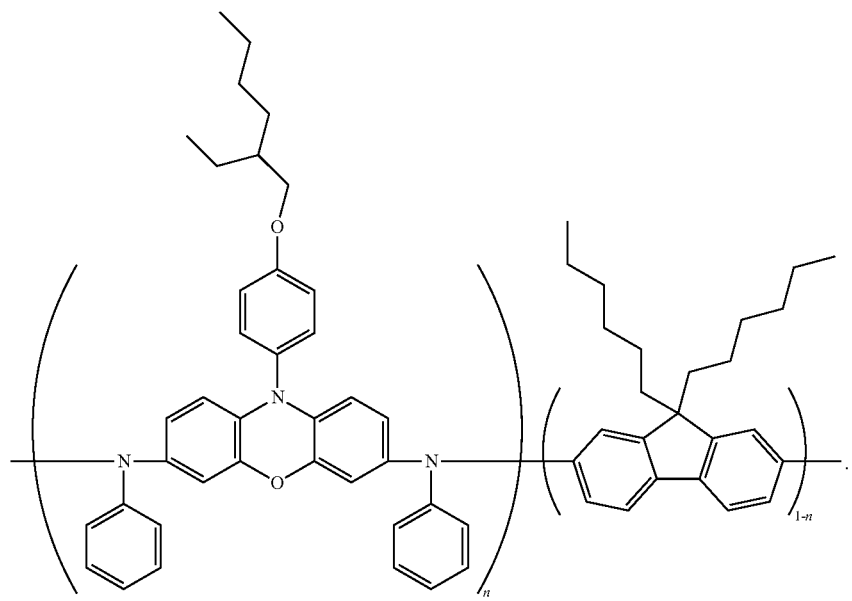
[Formula 9]

6. The polymer of claim 1, wherein the molecular weight dispersion of the polymer is from about 1.5 to about 4.

7. The polymer of claim 1, wherein the polymer is used in an organic light-emitting device.

8. The polymer of claim 1, wherein the polymer is represented by Formulae 3 below:

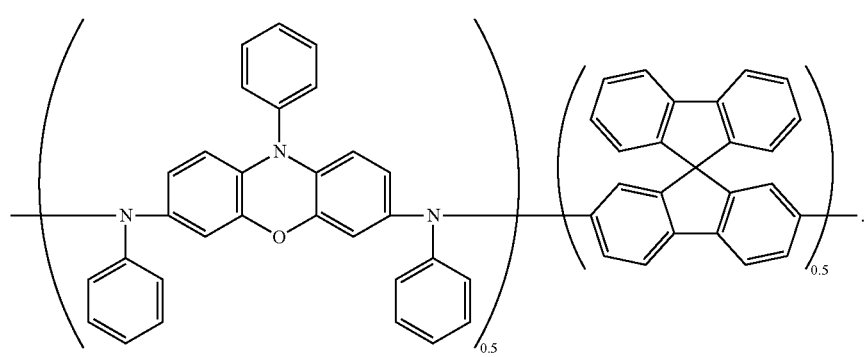
[Formula 3]

9. The polymer of claim 1, wherein the polymer is represented by Formulae 4 below:

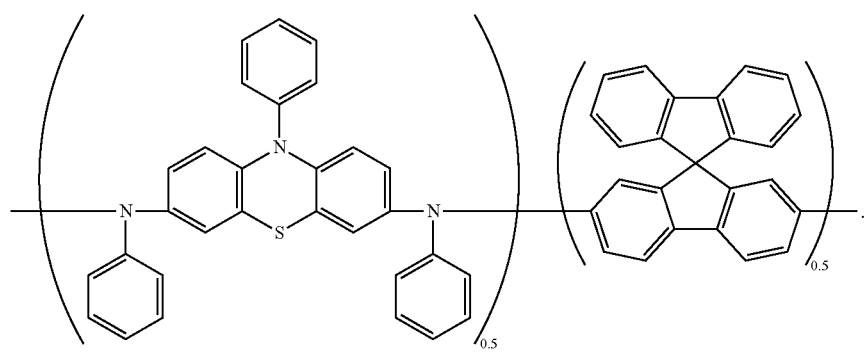

[Formula 4]

10. An organic light-emitting device comprising:
a first electrode;
a second electrode; and
an organic layer interposed between the first electrode and the second electrode,
wherein the organic layer comprises at least one layer comprising the polymer of claim 1.

11. The organic light-emitting device of claim 10, wherein the organic layer comprises a hole transport layer.

12. The organic light-emitting device of claim 10, wherein the organic layer comprises an emission layer.

13. An organic light-emitting device comprising:
a first electrode;
a second electrode; and
an organic layer interposed between the first electrode and the second electrode,
wherein the organic layer comprises at least one layer comprising the polymer of claim 8.

14. An organic light-emitting device comprising:
a first electrode;
a second electrode; and
an organic layer interposed between the first electrode and the second electrode,
wherein the organic layer comprises at least one layer comprising the polymer of claim 9.

* * * * *